United States Patent [19]
Okamura et al.

[11] Patent Number: 5,510,011
[45] Date of Patent: Apr. 23, 1996

[54] METHOD FOR FORMING A FUNCTIONAL DEPOSITED FILM BY BIAS SPUTTERING PROCESS AT A RELATIVELY LOW SUBSTRATE TEMPERATURE

[75] Inventors: Nobuyuki Okamura; Atsushi Yamagami, both of Kawasaki, Japan

[73] Assignee: Canon Kabushiki Kaisha, Tokyo, Japan

[21] Appl. No.: 362,750

[22] Filed: Dec. 22, 1994

Related U.S. Application Data

[63] Continuation of Ser. No. 149,230, Nov. 9, 1993, abandoned.

[30] Foreign Application Priority Data

Nov. 9, 1992 [JP] Japan .................................. 4-298893
Oct. 29, 1993 [JP] Japan .................................. 4-292459

[51] Int. Cl.$^6$ .................................................. C23C 14/34
[52] U.S. Cl. ................................. 204/192.3; 204/192.25; 204/298.06; 204/298.08; 437/108; 437/109
[58] Field of Search .......................... 204/192.3, 298.06, 204/298.08, 192.25; 437/108–109

[56] References Cited

U.S. PATENT DOCUMENTS 4,874,494 10/1989 Ohmi ............................. 204/192.12
4,963,239 10/1990 Shimamura et al. .............. 204/192.12
4,999,096 3/1991 Nihei et al. ........................ 204/192.3
5,194,398 3/1993 Miyachi et al. ...................... 437/108
5,242,561 9/1993 Sato ................................ 204/192.33

FOREIGN PATENT DOCUMENTS

WO9109161 6/1991 Japan ................................. 204/192.3

*Primary Examiner*—Aaron Weisstuch
*Attorney, Agent, or Firm*—Fitzpatrick, Cella, Harper & Scinto

[57] ABSTRACT

In a bias sputtering method comprising generating a plasma of a sputtering gas between a target electrode having a target thereon and a substrate electrode having a substrate for film formation thereon in a vacuum vessel with the use of a high frequency energy from a high frequency power source and sputtering said target with said plasma while applying a direct current voltage from a direct current power source to at least one of said target electrode or said substrate electrode thereby causing the formation of a film on said substrate, the improvement which comprises alternately repeating a deposition step and a non-deposition step, said deposition step comprising sputtering said target with said plasma while irradiating said substrate with ions of said plasma while depositing a film on said substrate, and said non-deposition step comprising irradiating said substrate with ions of said plasma without sputtering said target, thereby forming a high quality functional deposited film on said substrate.

10 Claims, 7 Drawing Sheets

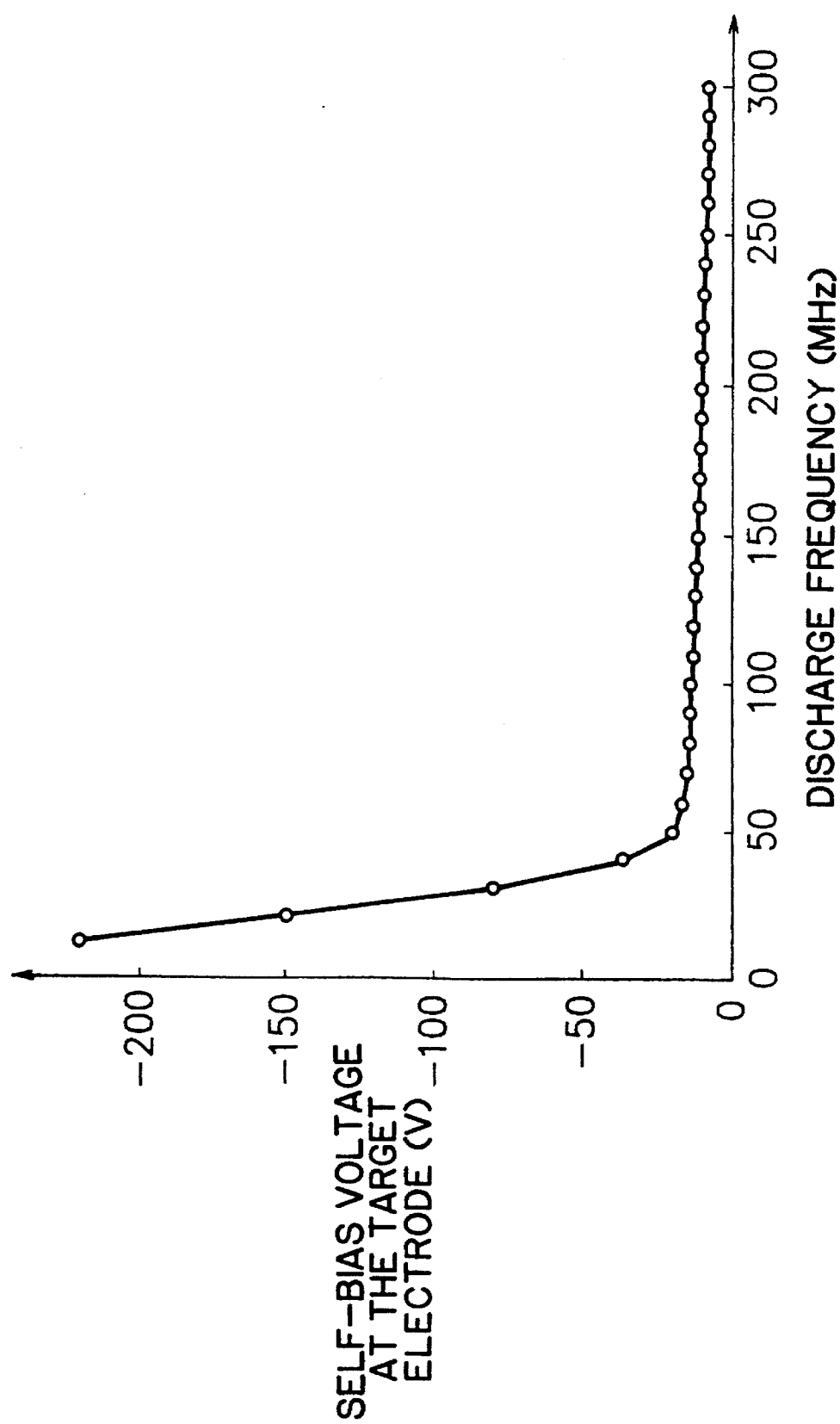

METHOD FOR FORMING A FUNCTIONAL DEPOSITED FILM BY BIAS SPUTTERING PROCESS AT A RELATIVELY LOW SUBSTRATE TEMPERATURE

This application is a continuation of application Ser. No 08/149,230 filed Nov. 9, 1993, now abandoned.

BACKGROUND OF THE INVENTION

1. Field of the Invention

The present invention relates to an improvement in a bias sputtering method of forming a functional deposited film on a given substrate. More particularly, the present invention relates to an improved bias sputtering method which enables one to effectively form a high quality functional deposited film on a given substrate such as single crystal substrates at a relatively low substrate temperature.

2. Description of Related Background Art

There have been proposed a number of sputtering methods for forming a deposited film on a substrate such as a single crystal wafer for use in semiconductor devices. Those sputtering methods generally use a substantially enclosed reaction vessel provided with a target electrode having a sputtering target disposed thereon and a substrate holder having thereon a substrate on which a film is to be deposited. They introduce a sputtering gas into the reaction vessel, adjust the inner pressure of the reaction vessel to a vacuum of about $1 \times 10^{-3}$ to $1 \times 10^{-4}$ Torr, and apply a given D.C. (direct current) or A.C. (alternate current) voltage to the target electrode to cause glow discharge, thereby producing a plasma in the reaction vessel. Ions of the plasma are accelerated to collide against the surface of the target to liberate particles of the constituent atoms of the target and those particles form a deposited film on the surface of the substrate.

In recent years, a so-called bias sputtering method has been developed. The bias sputtering method is a modification of the method in which sputtering during film formation is conducted while controlling the energy of the ions from the plasma which impinges the surface of the substrate by applying a given bias voltage to the substrate or cathode. The bias sputtering method is advantageous in that the energy of ions impinging the substrate during film formation is controlled, hence a deposited film with good step coverage can be formed when the energy of the ions impinging the substrate is reduced.

An example of such a bias sputtering method and apparatus is disclosed in U.S. Pat. No. 4,874,494 to Ohmi (hereinafter referred to as Ohmi). Particularly, Ohmi discloses a bias sputtering apparatus provided with a power source of a high frequency greater than 100 MHz, means for applying a desired DC bias potential, and means for generating a magnetic field and a film-forming method using said bias sputtering apparatus in which Ar gas is used as the sputtering gas. The bias sputtering apparatus is shown in FIG. 7.

Description will now be made of the apparatus shown in FIG. 7. Reference numeral 705 indicates a vacuum chamber containing a target 701 (of Al, for example) disposed on a target electrode 702 and a silicon wafer 703 (as a substrate) disposed on a susceptor 704 (that is, a substrate electrode), wherein the target 701 is positioned opposite the substrate 703. Reference numeral 708 indicates a permanent magnet for magnetron discharge which is disposed behind the target electrode 702. Reference numeral 709 indicates an RF power source which is electrically connected to the target electrode 702 through a matching circuit 710. Reference numeral 706 indicates a DC power source which is electrically connected to the target electrode 702 through a filter 711 capable of cutting off high frequencies. The substrate (the silicon wafer) 703 and the substrate electrode 704 are high frequency grounded by means of a capacitor 712 and electrically connected to a DC power source 707 through a filter 711. Reference numeral 713 indicates a gas feed pipe, and reference number 714 indicates an exhaust pipe.

Ohmi teaches that, according to the bias sputtering apparatus, a self-bias expressed by the equation $Vp+ |V_1|$ or $Vp+|V_2|$ (with Vp being a plasma potential, $V_1$ being an output voltage of the DC power source 707, and $V_2$ being an output voltage of the DC power source 706) can be independently controlled. Because of this, the ion accelerating voltage to the target can be increased by increasing $|V_1|$, wherein the rate of sputtering is raised, resulting in increasing the speed of film formation. Ohmi also teaches that, according to the bias sputtering apparatus, due to using a power source of a high frequency greater than 100 MHz as the RF power source, a plasma can be generated at a high density and the width of the kinetic energy distribution of ions in the plasma can be reduced to about 1/10 or less as compared with using an RF power source of a high frequency of 13.56 MHz. Almost all the Ar ions can be bombarded onto the surface of the substrate with desired kinetic energy, wherein film formation by bias sputtering can be conducted substantially with no damage to the substrate to obtain a high quality single crystal Al thin film formed on the silicon wafer.

In Ohmi, as the material of the target, there are illustrated, other than Al, alloys of Al-Si and Al-Si-Cu, and silicides of $MoSi$, $WSi$, $TaSi_2$, and $TiSi_2$. For the film, Ohmi illustrates, other than the above Al film, insulating films such as $SiO_2$, $Al_2O_3$, and $Si_3N_4$.

Ohmi does not disclose anything about the formation of a so-called epitaxial semiconductor film such as epitaxial silicon-containing semiconductor films doped with an impurity.

Ohmi does not expressly disclose the substrate temperature during forming of the single crystal Al film.

Now, it is understood that Ohmi is directed to the formation of a single crystal Al film. As for the alloy films, silicide films, and insulating films other than the single crystal Al film, Ohmi simply mentions these films and does not provide details about the forming conditions including the substrate temperature.

It is generally known that in order to form a crystalline insulating film such as $SiO_2$, $Al_2O_3$, and $Si_3N_4$ by the bias sputtering technique, the substrate temperature during film formation must be relatively high, and, where the bias sputtering method technique is conducted at a relatively low substrate temperature, these films unavoidably become amorphous. Thus, in forming insulating films by the bias sputtering method described in Ohmi, the substrate temperature is relatively high.

Further, it is also generally known that in forming a deposited film by the bias sputtering technique, not only foreign matter such carbon (C) and oxygen (O) but also the sputtering gas constituent such as argon (Ar) contained in the film-forming atmosphere may contaminate the film. It is understood that this will occur in the bias sputtering method described in Ohmi since no solution for this is described therein.

PCT international publication WO91/09161 (hereinafter referred to as Ichikawa) discloses a process for forming a silicon-containing semiconductor epitaxial film using a bias sputtering apparatus similar to that disclosed in Ohmi. The process described in Ichikawa is aimed at forming a silicon-containing semiconductor epitaxial film while eliminating contamination of the film by foreign matter such as carbon (C), oxygen (O) and argon (Ar). Particularly, the process described in Ichikawa comprises sputtering a target while applying a bias and a high frequency power for plasma generation to the target while maintaining the substrate at a temperature of 400° C. to 700° C. in an atmosphere where the partial pressure of each of $H_2O$, CO, and $CO_2$ is $1.0 \times 10^{-8}$ Torr or less while forming an epitaxial film on the substrate. In the process of Ichikawa, Ar gas is mainly used as the sputtering gas.

Incidentally, there is an increased demand for attaining a precisely controlled dopant profile for an epitaxial semiconductor film in order to obtain a high performance semiconductor device. However, each of the bias sputtering methods described in Ohmi and Ichikawa is not sufficient in order to satisfy this requirement. Than is, Ohmi does not provide any information about the formation of such an epitaxial semiconductor film. The film formation by the bias sputtering method described in Ichikawa is conducted at a relatively high temperature. Therefore, the bias sputtering method described in Ichikawa is problematic in that atoms of an impurity (that is, a dopant) unavoidably diffuse due to high substrate temperature during film formation.

Hence, the bias sputtering methods described in Ohmi and Ichikawa have difficulty attaining a precisely controlled dopant profile for the semiconductor epitaxial film.

The reason that a desirable silicon-containing semiconductor epitaxial film usable in a high performance semiconductor device is not obtained is chiefly due to a too high substrate temperature during film formation.

To solve the above problem, it is important to lower the film-forming temperature (that is, the substrate temperature). However, Ar gas as the sputtering gas will be unavoidably incorporated into the film formed.

In fact, the present inventors made studies by forming a plurality of silicon-containing epitaxial semiconductor films on silicon wafers in accordance with the bias sputtering film-forming process described in Ichikawa. The results revealed that when the substrate temperature is 400° C. or greater, there can be relatively stably obtained a desirable silicon-containing epitaxial film. However, it is not satisfactory in terms of precisely controlled dopant profile, and when the substrate temperature is less than 400° C., the resulting silicon-containing epitaxial film is inferior in semiconductor characteristics.

PCT international publication WO91/09150 (hereinafter referred to as Publication 3) discloses a plasma processing method comprising introducing a processing gas into a vacuum vessel containing a workpiece to be processed placed on a workpiece electrode, applying energy to said plasma processing gas to generate plasma and processing said workpiece with said plasma, wherein a first step and a second step are alternately repeated. Said first step comprises carrying out ion irradiation by applying a negative voltage to said workpiece electrode while controlling said voltage such that the voltage of said workpiece electrode versus the potential of said plasma is maintained constant, thereby making the energy possessed by ions in the plasma to be irradiated to said workpiece with an energy as desired. Said second step comprises irradiating electrons in said plasma to said workpiece by applying a positive voltage to said workpiece electrode and a plasma processing apparatus suitable for practicing said plasma processing method. Publication 3 teaches that, according to the plasma processing method, the ions in the vacuum vessel are controlled to be of a particular energy value with little energy variance. Thus, it is possible to process a workpiece at a high speed with high efficiency without causing damage. However, the plasma processing method described in Publication 3 is specifically directed to plasma etching technique and a plasma CVD technique and it is apparently different from the sputtering technique. Particularly, Publication 3 does not describe anything about the formation of an epitaxial film by means of the bias sputtering method.

SUMMARY OF THE INVENTION

A principal object of the present invention is to eliminate the foregoing problems in the conventional bias sputtering method and to provide an improved bias sputtering method which enables one to form a high quality semiconductor film at a relatively low substrate temperature.

Another object of the present invention is to provide an improved bias sputtering method which enables one to form a high quality silicon-containing semiconductor film on a given substrate with a desirably controlled dopant profile usable in a high performance semiconductor device at a relatively low substrate temperature without incorporation of sputtering gas into the film and without subjecting the film deposited on the substrate to ion damage.

A further object of the present invention is to provide an improvement in a bias sputtering method, comprising generating a plasma between a target electrode having a target thereon and a substrate electrode having a substrate for film formation with the use of a high frequency energy in a vacuum vessel and sputtering said target with said plasma while applying a bias voltage to at least one of said target electrode or said substrate electrode, thereby causing the formation of a film on said substrate. The improvement comprises alternately repeating a deposition step and a non-deposition step while maintaining the substrate at a low temperature of less than 400° C. Said deposition step comprises conducting the sputtering of the target while irradiating the substrate with ions of the plasma while depositing the film on the substrate. Said non-deposition step comprises irradiating the substrate with ions of the plasma without conducting the sputtering of the target, whereby a high quality silicon-containing semiconductor film with a desirably controlled dopant profile usable in a high performance semiconductor device is formed on the substrate.

BRIEF DESCRIPTION OF THE DRAWINGS

FIG. 4 is a graph showing the interrelations between discharge high frequency and bias potential induced at the target electrode which were determined in the later described experiments in the present invention.

DESCRIPTION OF THE INVENTION AND THE PREFERRED EMBODIMENTS

Figure 1:
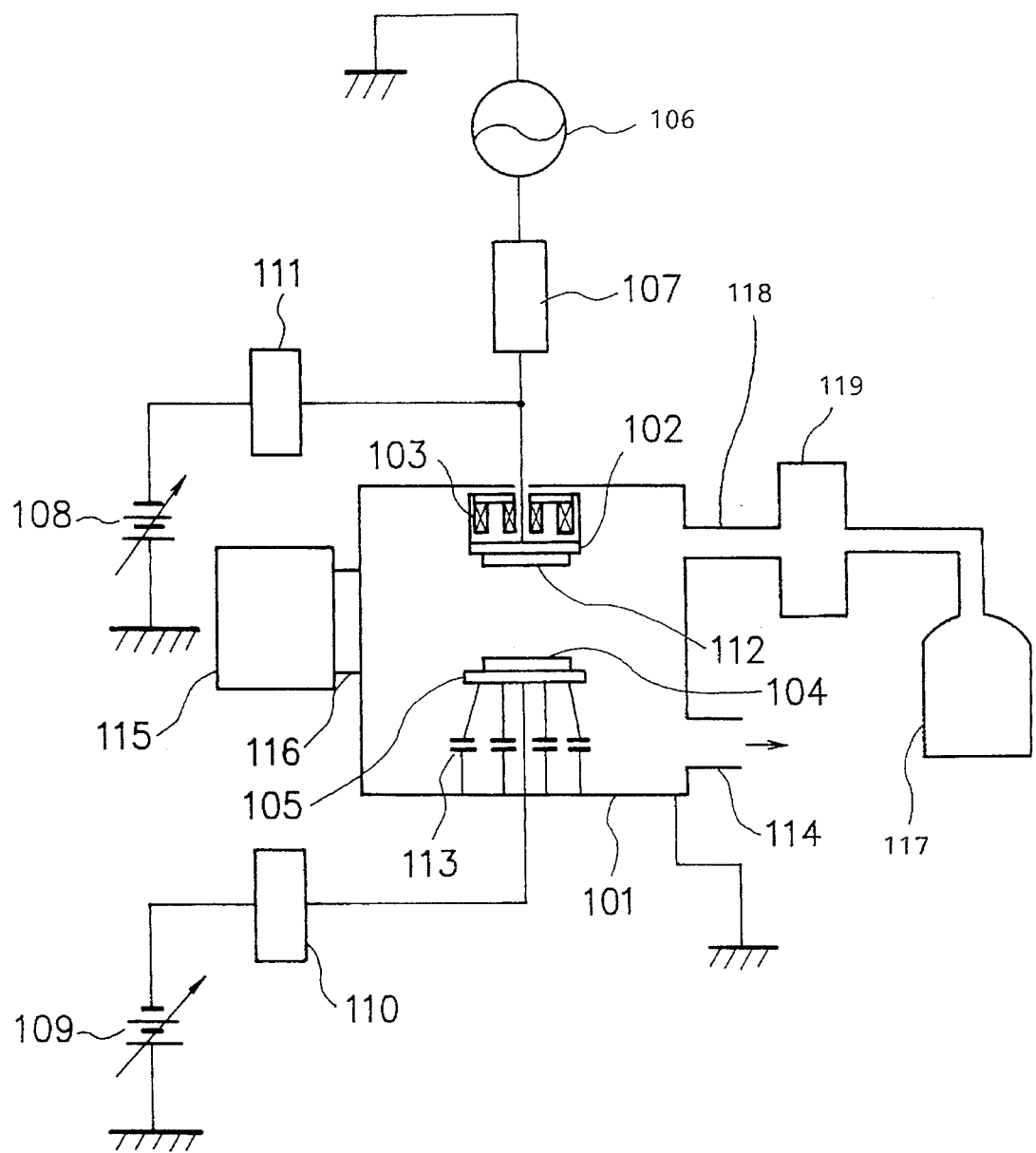
FIG. 1 is a schematic diagram of a bias sputtering apparatus suitable for practicing a bias sputtering method according to the present invention.

The present invention is directed to an improvement in a bias sputtering method, comprising generating a plasma of a sputtering gas between a target electrode having a target thereon and a substrate electrode having a substrate for film formation in a vacuum vessel with the use of a high frequency energy and sputtering said target with said plasma while applying a bias voltage to at least one of said target electrode and said substrate electrode thereby causing the formation of a film on said substrate. The improvement comprises alternately repeating a first step and a second step while maintaining the substrate at a relatively low temperature. Said first step comprises conducting the sputtering of the target while irradiating the substrate with ions of the plasma to deposit a film on the substrate. Said second step comprises irradiating the substrate with ions of the plasma without conducting the sputtering of the target, whereby a high quality silicon-containing semiconductor film usable in a high performance semiconductor device is effectively formed on the substrate.

According to the bias sputtering method of the present invention, the step of depositing a film on the substrate by sputtering the target (the first step) and the step of irradiating the substrate having the film deposited thereon with ions of the plasma without sputtering the target (the second step) are alternately repeated while maintaining the substrate at a relatively low temperature. Because of this, the sputtering gas such as Ar gas, Ne gas or the like is effectively prevented from contaminating the film deposited on the substrate. In addition, in the bias sputtering method according to the present invention, the ion irradiation of the substrate in the second step serves to migrate the constituent atoms of the target which have been deposited on the substrate in the first step into a desirable state thereby causing the formation of a high quality functional deposited film on a substrate at a relatively low substrate temperature, specifically, of less than 400° C. Particularly, the bias sputtering method of the present invention enables one to form a high quality semiconductor epitaxial film excelling in step coverage at a relatively low substrate temperature of less than 400° C. Further, the bias sputtering method of the present invention makes it possible not only to establish an excellent interfacial state between the adjacent films of a stacked semiconductor structure but also to attain a desirable dopant profile for each of the adjacent films therein at a relatively low substrate temperature.

The present invention has been accomplished as a result of repeated experimental studies by the present inventors in order to attain the foregoing objects.

In the following, experiments which were conducted by the present inventors will be described.

Experiment 1

In this experiment, studies were made of the problems which make it impossible to form a desirable silicon-containing semiconductor epitaxial film on a silicon wafer at a low substrate temperature in the bias sputtering technique described in the foregoing Ichikawa reference.

There were formed a plurality of silicon-containing film samples each on a given silicon wafer at a different substrate temperature in accordance with the bias sputtering technique described in the Ichikawa reference, using the apparatus shown FIG. 1.

In FIG. 1, reference numeral 101 indicates a vacuum vessel containing a sputtering target 112 disposed on a target electrode 102 and a silicon wafer 104 (as a substrate) disposed on a substrate electrode 105, wherein the target 112 is positioned opposite the substrate 104. The vacuum vessel 101 used herein is made of a stainless steel of SUS316 (trademark name) type and it has an electropolished inner wall face of Rmax<0.1 μm in surface smoothness. Reference numeral 103 indicates a permanent magnet for magnetron discharge which is disposed behind the target electrode 102. Reference numeral 106 indicates a RF power source of 100 MHz in frequency which is electrically connected to the target electrode 102 through a matching circuit 107. Reference numeral 108 indicates a DC power source which is electrically connected to the target electrode 102 through a filter 111 capable of serving to cut off high frequencies. The substrate (the silicon wafer) 104 and the substrate electrode 105 are high frequency grounded by means of capacitors 113 and are electrically connected to a DC power source 109 through a filter 110. Reference numeral 118 indicates a gas feed pipe which is connected through a gas purification device 119 (PRF700IC-R64, trademark name, produced by SAES GETTERS Company) to a gas cylinder 117 containing Ar gas of 5N (purity: 99.999%). Reference numeral 114 indicates an exhaust pipe connected to an oil-free vacuum system comprising two magnetic levitation type tandem turbomolecular pumps serially connected and an auxiliary pump (not shown). The vacuum system is designed such that no foreign matter is provided in the inside of the vacuum vessel 101. Reference numeral 115 indicates a load lock chamber for carrying the substrate into or out of the system. The load lock chamber 115 is connected through a gate valve 116 to the vacuum vessel 101.

In the formation of each silicon-containing film sample, there was used an n-type FZ(100) Si wafer of $1.8 \times 10^{18}$ cm$^{-3}$ in phosphorous (P) content and 5 inches in diameter as the target 112, and as the substrate 104, there was used a p-type FZ(100) Si wafer of $1.0 \times 10^{15}$ cm$^{-3}$ in boron (B) content and 4 inches in diameter.

In this experiment, silicon-containing film samples were formed on substrates (Si wafers) 104 in the manner described below. For each silicon-containing film thus obtained, there were conducted crystal analysis by means of electron diffraction, resistivity measurement by means of the four-point probe method, measurement of Ar, C, and O contents by means of SIMS (secondary ion mass spectrometry), and measurement of the reverse current density of the p-n junction.

Figure 2A:
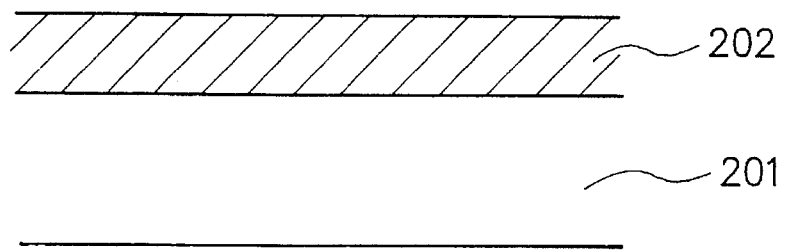
FIG. 2(A), FIG. 2(B), and FIG. 2(C) are schematic explanatory views of the steps of preparing a substrate for a semiconductor device in the present invention.
Figure 2B:
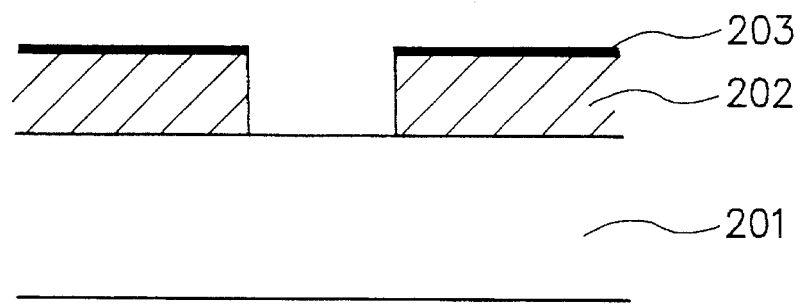
Figure 2C:
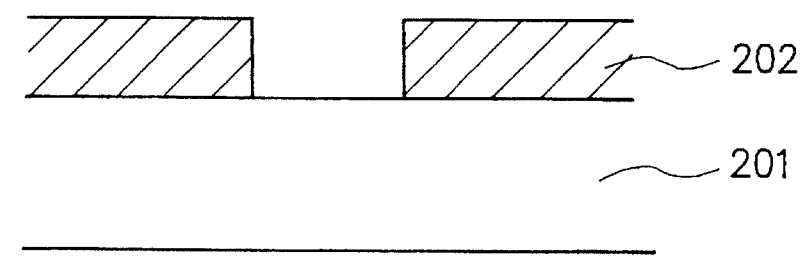

For the purpose of facilitating these measurements, prior to subjecting the Si wafer as the substrate to film formation, the Si wafer was patterned in a manner shown in FIGS. 2(A) through 2(C). That is, on the Si wafer (reference numeral 201), there was formed an about 2000 Å thick SiO$_2$ film 202 by means of the resistance heating deposition method (see FIG. 2(A)). Then, a 1 μm thick resist film 203 of OFPR (trademark name, produced by Tokyo Ohka Kabushiki Kaisha) was formed on the SiO$_2$ film 202 by means of a coating technique, followed by exposure, development, and etching to thereby remove a given portion of the resist film 203 and the $SiO_2$ film 202 so that a portion of the surface of the Si wafer was exposed at the resultant recess (see FIG. 2(B)). The resultant was immersed in a solution of hydrogen peroxide in sulfuric acid at 120° C. to remove the resist film 203 (see FIG. 2 (C)).

The thus-treated Si wafer was used as the substrate 104. The substrate was cleaned by means of a conventional substrate cleaning technique and introduced into the load lock chamber 115. The load lock chamber 115 was evacuated to bring the inside thereof to a vacuum of about $1 \times 10^{-10}$ Torr by means of a vacuum system (not shown), and at the same time the vacuum vessel 101 was also evacuated to bring the inside thereof to the same vacuum as that of the load lock cheer by actuating the foregoing oil-free vacuum system. The gate valve 116 was opened, and the substrate 104 was moved into the vacuum vessel 101 by a transport means (not shown), wherein the substrate 104 was positioned on the substrate electrode 105. After closing the gate valve 116, the substrate 104 was heated to and maintained at 300° C. by energizing a heater (not shown) installed in the substrate electrode 105.

The inner pressure (that is, the background vacuum) of the vacuum vessel 101 was $2.2 \times 10^{-10}$ Torr.

Then, a valve (not shown) of the gas cylinder 117 was opened to feed Ar gas into the vacuum vessel 10i through the feed pipe 118 while purifying the Ar gas by the gas purification device 119. The gas pressure in the vacuum vessel 101 was adjusted to and maintained at 10 mTorr. The RF power source 106 was switched on to apply a high frequency power of 30 W (100 MHz), and the DC power source 108 was switched on to apply a DC voltage of −30 V. The DC power source 109 was also switched on to apply a DC voltage of +15 V, to generate a plasma in the vacuum vessel 101, thereby cleaning the surface of the substrate 101 with plasma for 5 minutes. The plasma in this case was of a low intensity and because of this the target was not sputtered.

Thereafter, film formation was conducted under the conditions shown in Table 1 while maintaining the substrate 104 at 300° C., whereby an about 1000 Å thick silicon film was formed on the surface of the patterned Si wafer. Thus, there was obtained a silicon film sample having a p-n junction.

The above procedures were repeated, except that the substrate temperature upon film formation was changed to 350° C., 400° C., 450° C., or 500° C. In this way, an about 1000 Å thick silicon film was formed on the surface of the patterned Si wafer at each temperature whereby a silicon film sample having a p-n junction was obtained in each case.

Thus, there were obtained five silicon film samples each having a p-n junction and each formed at a different substrate temperature.

Each of the five silicon film samples was subjected to (a) crystal analysis by means of electron diffraction, (b) resistivity measurement by means of the four-point probe method, (c) measurement of Ar, C, and O contents by means of SIMS, and (d) measurement of the reverse current density of the p-n junction. The measurement (d) was conducted in the following manner: A pair of electrodes are disposed on the silicon film sample and a given voltage is applied between the two electrodes, wherein the electric current which flows between the two electrodes is measured.

The measured results obtained are collectively shown in Table 2. In Table 2, the background vacuum degree during each film formation is also shown.

On the basis of the results shown in Table 2, there were obtained the following findings: (i) a single crystal silicon film showing a Kikuchi line in the electron diffraction can be obtained at a substrate temperature of 300° C. to 500° C.; (ii) when the substrate temperature is 400° C. or above, there can obtained a single crystal silicon film which is satisfactory with respect to resistivity and p-n junction reverse current density which are the most important electric characteristics in the preparation of a semiconductor device, but when the substrate temperature is less than 400° C., there cannot be obtained a single crystal silicon film that is satisfactory with respect to resistivity and p-n junction reverse current density; (iii) the contamination of the film by each of oxygen (O) and carbon (C) is more or less around the same and satisfactory at each substrate temperature in the range of 300° C. to 500° C., but the contamination of the film with argon (Ar) is increased as the substrate temperature is decreased, wherein it is unacceptable when the substrate temperature is less than 400° C.; and (iv) the reason a desirable single crystal silicon film which is satisfactory with respect to resistivity and p-n junction reverse current density cannot be obtained at a substrate temperature of less than 400° C. is due to argon (Ar) contamination described in the above (iii).

In addition to the above findings (i) to (iv), the following findings were obtained: (v) it is important to make the atoms (liberated from the target) causing the formation of a film on the substrate (hereinafter referred to as "film-forming atoms") to possess greater energy so that they migrate as desired on the surface of the substrate, in order to form a high quality epitaxial silicon film; (vi) when the substrate temperature during film formation is high, there is a slight occasion for atoms (contaminant atoms such as Ar atoms) other than the film-forming atoms to deposit on the surface of the substrate and because of this, the film-forming atoms desirably migrate on the surface of the substrate as long as they possess great energy, whereby a desirable epitaxial film is formed on the substrate; (vii) when the substrate temperature during film formation is relatively low, the contaminant atoms become liable to deposit on the surface of the substrate and prevent the film-forming atoms deposited thereon from migrating in a desirable state even though the film-forming atoms possess great energy, wherein the resulting epitaxial film is contaminated with Ar atoms, which is not satisfactory in terms of film quality and inferior in semiconductor characteristics.

Experiment 2

In this experiment, with reference to the findings obtained in Experiment 1, the present inventors conducted studies in order to find an appropriate method which enables formation of a high quality epitaxial film at relatively low substrate temperature while preventing argon atoms (Ar) of the sputtering gas from contaminating the film during the film formation, using the bias sputtering apparatus shown in FIG. 1.

The present inventors presumed that contamination of the epitaxial film formed on the substrate in Experiment 1 with Ar atoms would occur as a result of Ar ions from the Ar sputtering gas which irradiates the deposited film-forming atoms imparting kinetic energy to facilitate their migration on the substrate.

Based on this presumption, the present inventors studied Ar ion assisted migration of the film-forming atoms on the surface of the substrate during film formation through the following experiments.

Particularly, using the bias sputtering apparatus shown in FIG. 1, studies were conducted on how the application of a given DC voltage to the target electrode 102 by the DC power source 108 influences the formation of an epitaxial film on the substrate by conducting the film formation while switching the DC power source 108 on and off.

Specifically, the film-forming procedures of Experiment 1 were repeated under the conditions shown in Table 3, wherein the substrate temperatures was made constant at 300° C., the DC power source 108 was switched on-off at an interval of 3 seconds so that a DC voltage of −200 V was applied to the target electrode 102 when the DC power source was switched on and no DC voltage was applied to the target electrode when the DC power source was switched off. Thereby an epitaxial silicon film was formed on a p-type FZ(100) Si wafer of $1.0 \times 10^{15}$ cm$^{-3}$ in boron (B) content and 5 inches in diameter without having been patterned as in Experiment 1.

In the above, there were observed an interrelation between the deposition rate and the film formation period and an interrelation between the amount of ions impinging the substrate and the film formation period.

Figure 3A:
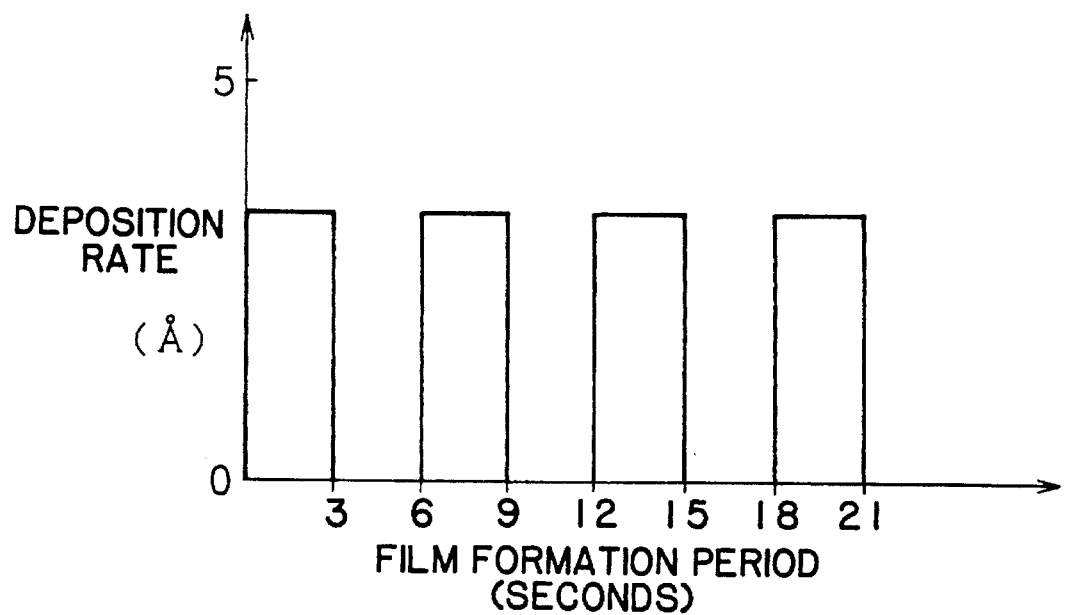
FIG. 3(A) is a graph showing the interrelations between the film formation period and the deposition rate in the respective deposition steps which were determined in the later described experiments in the present invention.

The observed results of the interrelation between the film deposition rate and the film formation period are graphically shown in FIG. 3(A). The observed results of the interrelation between the amount of ions impinging the substrate and the film formation period are graphically shown in FIG. 3(B).

Measurement of the film deposition rate in the above was conducted by means of a film thickness measuring instrument (not shown) disposed in the vicinity of the substrate 104 in the bias sputtering apparatus shown in FIG. 1. The film deposition rate was calculated based on a value obtained by measuring the thickness of the film deposited on the substrate and a value from the film thickness measuring instrument.

Measurement of the amount of ions impinging the substrate was conducted by an ion collecting orifice of an ion detecting device PPM400 (trademark, produced by BALZARS, ELA) embedded in a hole of 10 mm in diameter formed at the center of the substrate electrode 105 in the bias sputtering apparatus shown in FIG. 1.

Figure 3B:
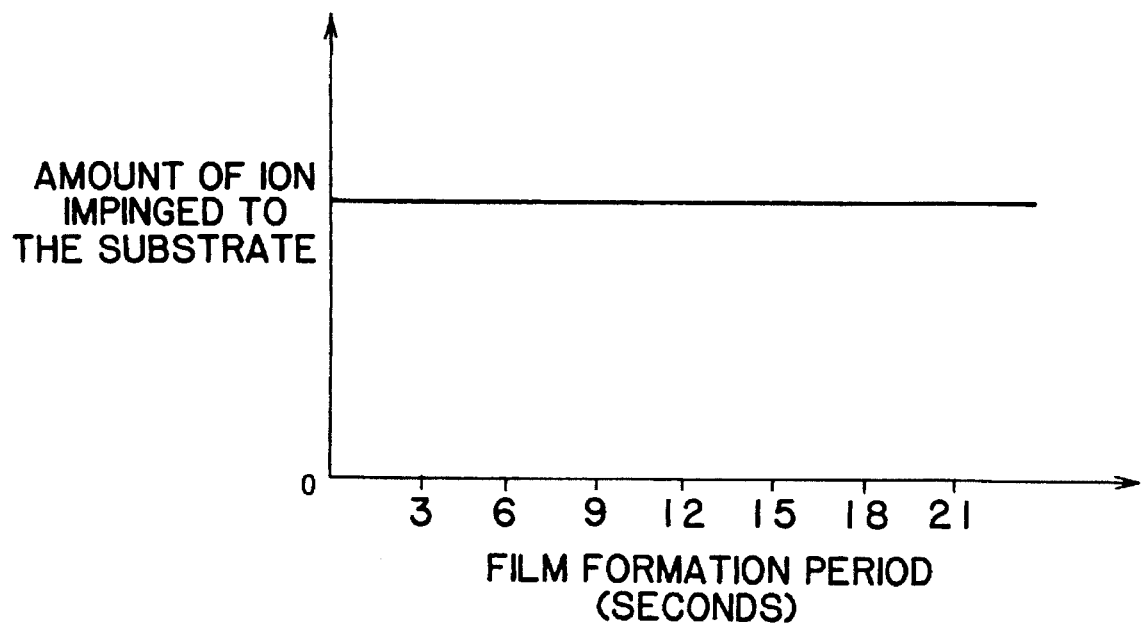
FIG. 3(B) is a graph showing the interrelations between the film formation period and the magnitude of ions impinged on the substrate which were determined in the later described experiments in the present invention.

Based on the results shown in FIGS. 3(A) and 3(B), when the application of a given DC voltage by the DC power source connected to the RF power source side is on-off controlled, there can be established a pair of alternate periods, i.e., a deposition period and a non-deposition period, wherein no change occurs in the amount of ions impinging the substrate.

Experiment 3

With reference to the findings of Experiment 2, an epitaxial silicon film was formed using the bias sputtering apparatus shown in FIG. 1, wherein the deposition period obtained by switching on the DC power source 108 and the non-deposition period (the ion impinging period or the ion assist period) obtained by switching off the DC power source were alternately repeated to form a cycle.

Specifically, there was provided a p-type FZ(100) Si wafer of $1.0 \times 10^{15}$ cm$^{-3}$ in boron (B) content and 5 inches in diameter. This Si wafer was patterned in the same manner as in Experiment 1. The resultant patterned Si wafer was used as the substrate 104 in the bias sputtering apparatus. The patterned Si wafer was positioned on the substrate electrode 105 of the bias sputtering apparatus. The film-forming procedures of Experiment 1 were repeated, except that the DC power source 108 was switched on-off at an interval of 3 seconds so that a DC voltage of −200 V was applied to the target electrode 102 when the DC power source was switched on and no DC voltage was applied to the target electrode when the DC power source was switched off, whereby an epitaxial silicon film was formed on the patterned Si wafer as the substrate 104. This film formation was conducted at substrate temperatures of 150° C., 200° C., 250° C., 300° C., 350° C., 380° C., 400° C., 450° C. and 500° C. to obtain nine epitaxial silicon film samples each having a p-n junction.

In each of the resultant nine epitaxial silicon film samples, crystal analysis, resistivity measurement, measurement of Ar, C, and O contents, and measurement of the reverse current density of the p-n junction were conducted in the same manner as in Experiment 1.

The results obtained are collectively shown in Table 4. In Table 4, the degree of background vacuum during each film formation is also shown.

Based on the results shown in Table 4, there were obtained the following findings.

(i) When the application of a given DC voltage to the target electrode is intermittently conducted by on-off controlling the DC power source connected to the RF power source side to alternately repeat a step of depositing a film on the substrate and a step of impinging ions (or conducting ion assist) to the substrate without film deposition, there can be formed a desirable epitaxial silicon film with little contamination of Ar atoms even at a relatively low substrate temperature of less than 400° C.

(ii) As is apparent from a comparison of the results shown in Table 2 with those in Table 4, when the substrate temperature is less than 400° C., although there is no distinguishable difference with respect to the contamination of the films by each of C (carbon atoms) and O (oxygen atoms), the resistivity and the reverse current of the p-n junction in the latter case (Table 4) markedly surpass those in the former case (Table 2). From this, it is understood that a remarkable improvement can be attained not only in the resistivity but also in the reverse current of the p-n junction.

(iii) When the application of a given DC voltage to the target electrode is intermittently conducted by on-off controlling the DC power source connected to the RF power source to alternately repeat a step of depositing a film on the substrate and a step of impinging ions (or conducting ion assist) to the substrate without film deposition, there can be formed a desirable semiconductor epitaxial silicon film markedly excelling in electric characteristics, i.e., resistivity and reverse current of the p-n junction, which are the most important factors in the preparation of a semiconductor device, even at a relatively low substrate temperature of less than 400° C.

(iv) It is possible to form a high quality epitaxial semiconductor film which is markedly low not only in Ar contamination from the sputtering gas but also in contamination by foreign matter, i.e., O (oxygen atoms) and C (carbon atoms). It also excels in electric characteristics, i.e., resistivity and reverse current of the p-n junction, which are most important factors in the preparation of a semiconductor device by the bias sputtering method, when alternately repeating a step of depositing a film on the substrate and a step of impinging ions (or conducting ion assist) to the substrate without film deposition while maintaining the substrate at a relatively low temperature, specifically, from 250° C. to 380° C.

Experiment 4

With reference to the findings obtained in Experiment 3, studies were conducted on the interrelation between the period of time during which the step of conducting deposition of a film on the substrate and that during which the step of impinging ions (or conducting ion assist) to the substrate without film deposition is conducted through the following Experiments 4-1 to 4-3.

Experiment 4-1

In this experiment, studies were conducted by employing the film-forming procedures in Experiment 3, and making the ratio of the deposition period during which the step of depositing a film on the substrate by switching on the DC power source 108 of the bias sputtering apparatus shown in FIG. 1 to the non-deposition period during which the step of impinging ions to the substrate without film deposition to be 1:1.

Specifically, the film-forming procedures of Experiment 3 were repeated, except that each of the deposition period and the non-deposition period was varied as shown in Table 5. The film formation was conducted until the thickness of the film deposited on a p-type FZ(100) Si wafer of $1.0 \times 10^{15}$ cm$^{-3}$ in boron (B) content and 5 inches in diameter without having been patterned as the substrate 104 became about 1000 Å. The substrate temperature during film formation was 300° C.

The mean deposition rate during each film deposition step was found to be 1.3 Å/sec.

The lattice constant of single crystal silicon is 5.43 Å. Therefore, said mean deposition rate means that silicon atoms are deposited at an about one silicon atom thick deposition rate per second.

In the above, there were obtained six epitaxial silicon film samples each having a p-n junction. As for each of the resultant six film samples, the content of each of Ar (argon atoms), O (oxygen atoms), and C (carbon atoms) was measured by SIMS. The measured results are collectively shown in Table 5.

From the results shown in Table 5, it is understood that when each repetition of the film depositing step is for 4 seconds or less or is of 4 silicon atoms thick or less, a high quality epitaxial silicon film with little argon (Ar) contamination is obtained. Based on this, the present inventors established a relational expression $Td \leq 5.43/N$, with N being the deposition rate (Å/sec.) and Td being the film formation period.

Experiment 4-2

This experiment was conducted to confirm whether the foregoing relational expression $Td \leq 5.43/N$ is effective when the deposition rate is varied.

(1) The film-forming procedures of Experiment 4-1 were repeated, except that the deposition rate during the step of depositing a film on the substrate 104 was changed by changing the DC voltage applied to the target electrode to −100 V, to thereby form an epitaxial silicon film on a p-type FZ(100) Si wafer of $1.0 \times 10^{15}$ cm$^{-3}$ in boron (B) content and 5 inches in diameter without having been patterned, wherein each of the deposition period and the non-deposition period was varied as shown in Table 6.

In the above, the ratio of the deposition period during which the step of depositing a film on the substrate is conducted and the non-deposition period during which the step of impinging ions to the substrate without film deposition is conducted was set at 1:1 in each case. The mean deposition rate in each film deposition step was found to be 0.9 Å/sec. There were obtained seven epitaxial silicon film samples each having a p-n junction. As for each of the resultant seven film samples, the Ar (argon atoms), O (oxygen atoms), and C (carbon atoms) content of each was measured by SIMS. The measured results are collectively shown in Table 6.

(2) The film-forming procedures of Experiment 4-1 were repeated, except that the deposition rate during the step of depositing a film on the substrate 104 was changed by changing the DC voltage applied to the target electrode to −300 V, to thereby form an epitaxial silicon film on a p-type FZ(100) Si wafer of $1.0 \times 10^{15}$ cm$^{-3}$ in boron (B) content and 5 inches in diameter without having been patterned, wherein each of the deposition period and the non-deposition period was varied as shown in Table 7.

In the above, the ratio of the deposition period during which the step of depositing a film on the substrate is conducted and the non-deposition period during which the step of impinging ions to the substrate without film deposition is conducted was set at 1:1 in each case. The mean deposition rate in each film deposition step was found to be 1.8 Å/sec. There were obtained six epitaxial silicon film samples each having a p-n junction. As for each of the resultant six film samples, the Ar (argon atoms), O (oxygen atoms), and C (carbon atoms) content of each was measured by SIMS. The measured results are collectively shown in Table 7.

From the results shown in Table 6, it is understood that when the mean deposition rate in each film deposition step is 0.9 Å/sec. and the film deposition period of each film deposition step is 5 seconds or less, a high quality epitaxial silicon film with little argon (Ar) contamination can be obtained.

From the results shown in Table 7, it is understood that when the mean deposition rate in each repetitive film deposition step is 1.8 Å/sec. and the film deposition period of each film deposition step is 3 seconds or less, a high quality epitaxial silicon film with little argon (Ar) contamination can be obtained.

Thus, it was found that the relational expression $Td \leq 5.43/N$ is effective when the deposition rate is varied.

Experiment 4-3

The film-forming procedures of Experiment 4-1 were repeated, except that (a) the deposition period during which the step of depositing a film on the substrate by switching on the DC power source 108 was constant at a period of 3 seconds and (b) the non-deposition period during which the step of impinging ions to the substrate without film deposition was varied from 1 to 6 seconds as shown in Table 8, to obtain six epitaxial silicon film samples each having a p-n junction.

For each of the resultant six film samples, the Ar (argon atoms), O (oxygen atoms), and C (carbon atoms) content of each was measured by SIMS. The measured results are collectively shown in Table 8.

From the results shown in Table 8, it is understood that when the non-deposition period (b) is 3 seconds or more, a high quality epitaxial silicon film with little argon (Ar) contamination can be obtained.

Based on this, it was found that there is a relational expression $Td \leq Ta$, with Ta being an ion assist period (a non-deposition period during which the step of impinging ions to the substrate without film deposition occurs) and Td being a deposition period during which the step of depositing a film on the substrate by switching on the DC power source 108 occurs.

The above film-forming procedures were repeated, except that the DC voltage applied to the target electrode was varied, to obtain a plurality of epitaxial silicon film samples. The resultant epitaxial silicon film samples were examined in the same manner as in the above.

As a result, it was found that the above relational expression is valid.

Experiment 5

Based on the results obtained in the above experiments, it was determined than to obtain an epitaxial silicon film excelling in film characteristics, it is important to alternately repeat (a) the film deposition step (the step of depositing a film on the substrate) and (b) the non-deposition step (the step of impinging ions to the substrate without film deposition).

In this experiment, studies were made of the range of frequency of the RF power source with which it is possible to conduct the film deposition step (a) and the non-deposition step (b) with good controllability for obtaining a high quality epitaxial silicon film.

Specifically, studies were made of the following two items: (1) the frequency of the RF power source at which the self-bias of the target electrode is lowered so that the film deposition step (a) and the non-deposition step (b) can be controlled as desired depending upon on-off control of the DC power source electrically connected to the target electrode and (2) the frequency of the RF power source at which the energy distribution of ions impinged to the substrate on which an epitaxial film is to be deposited is small.

Experiment 5-1

This experiment was conducted in order to find out the frequency (1).

A partial modification of the bias sputtering apparatus shown in FIG. 1 was used in which the DC power source 108 was replaced by a voltmeter (not shown) capable of monitoring the DC voltage of the self-bias induced at the target 112.

As the substrate 104, there was used a p-type FZ(100) Si wafer of $1.0 \times 10^{15}$ cm$^{-3}$ in boron (B) content and 5 inches in diameter. As the sputtering gas, argon gas (Ar) was used.

Film formation was conducted under the conditions shown in Table 9 by operating the above bias sputtering apparatus while varying the frequency of the signal generator of the RF power source 106 from 10 MHz to 40 MHz and adjusting the output power of the amplifier, wherein the self-bias at the target electrode 102 was measured by the foregoing voltmeter. The measured results are graphically shown in FIG. 4, in which the results are shown as the interrelation between the target electrode self-bias and the discharge frequency.

From the results shown in FIG. 4, it is understood that when the discharge frequency is in the range of 50 MHz to 300 MHz, the self-bias of the target electrode can be controlled to a low value of less than |25| V.

The above procedures were repeated, except for employing frequencies beyond 300 MHz. However, a stable discharge was not achieved.

Experiment 5-2

This experiment was conducted in order to find out the frequency (2).

A partial modification of the bias sputtering apparatus shown in FIG. 1 was used in which the substrate electrode 105 was replaced by one having a hole of 10 mm in size at the center thereof in which an ion collecting orifice of an ion detecting device PPM400 (trademark name, produced by BALZARS, ELA) is embedded in said hole (substrate not shown).

As the substrate 104, there was used a p-type FZ(100) Si wafer of $1.0 \times 10^{15}$ cm$^{-3}$ in boron (B) content and 5 inches in diameter. As the sputtering gas, argon gas (Ar) was used.

Film formation was conducted under the conditions shown in Table 9 by operating the above bias sputtering apparatus while varying the frequency of the signal generator of the RF power source 106 in the range of 10 MHz to 400 MHz and adjusting the output power of the amplifier, wherein the energy distribution of ions impinging the substrate was measured by the ion detecting device. The measured results are collectively shown in Table 10, in which the measured ion energy is shown in terms of energy distribution half width as a function of the discharge frequency.

From the results shown in Table 10, it is understood that when the discharge frequency is in the range of 50 MHz to 30 MHz, the energy distribution half width of the ions impinging the substrate is of a relatively small value of less than 10 eV.

Incidentally, in the case where the incident ion energy of the plasma on the surface of a film deposited on the substrate is great, the film is liable to suffer from ion damage and therefore, a high quality epitaxial film is not obtained. On the other hand, when the energy distribution half width of the incident ion energy of the plasma on the surface of a film deposited on the substrate is small, the ions of the plasma impinging thereon are controlled to be of substantially uniform energy distribution wherein the high energy ions of the plasma are prevented from impinging thereon. Because of this, a high quality epitaxial film can be desirably obtained without suffering ion damage.

Based on the results obtained in the above experiments, it was determined that when the frequency of the RF power source is in the range of 50 MHz to 300 MHz, the film deposition step (a) and the non-deposition step (b) can be controlled as desired depending upon on-off control of the DC power source, whereby a high quality epitaxial film can be obtained.

The present invention has been accomplished based on the findings obtained in the above Experiments 1 to 5.

The present invention is an improvement in a bias sputtering method for forming a functional deposited film on a substrate, which comprises generating a plasma of a sputtering gas between a sputtering target electrode having a target thereon and a substrate electrode having said substrate thereon with the use of a high frequency energy in a vacuum vessel. Said target is sputtered with said plasma while applying a bias voltage to either said target electrode or said substrate electrode to cause the formation of said deposited film on said substrate. The improvement comprises alternately repeating (a) a first step and (b) a second step while maintaining the substrate at a relatively low temperature. Said first step (a) comprises sputtering of the target while irradiating the substrate with ions of the plasma while depositing the film on the substrate. Said second step (b) comprises irradiating the substrate with ions of the plasma without sputtering of the target, whereby a high quality functional deposited film is effectively formed on the substrate.

According to the bias sputtering method of the present invention, in the film-forming chamber (the vacuum vessel), the step of depositing a film on the substrate by sputtering the target with the plasma generated in the vacuum vessel (the first step (a)) and the step of irradiating the substrate with ions of the plasma without sputtering the target, i.e., without depositing a film on the substrate (the second step (b)) are alternately repeated. Hence, the sputtering gas such as Ar gas, Ne gas, or the like is effectively prevented from contaminating the film deposited on the substrate. In addition, in the bias sputtering method of the present invention, the ion irradiation of the substrate in the second step (b) serves to migrate the constituent atoms of the target which have been deposited on the substrate in the first step (a) into a desirable state, thereby causing the formation of a high quality functional deposited film on a substrate at a relatively low substrate temperature of less than 400° C. Particularly, the bias sputtering method of the present invention enables one to form a high quality semiconductor epitaxial film excelling in step coverage at a relatively low substrate temperature of less than 400° C. Further, the bias sputtering method of the present invention makes it possible not only to establish an excellent interfacial state between adjacent films of a stacked semiconductor structure but also to attain a desirable dopant profile for each of the adjacent films at a relatively low substrate temperature of less than 400° C.

In the bias sputtering method of the present invention, it is important that the first step (a) (the deposition step) and the second step (b) (the repetitive non-deposition step) be alternated with each other with good controllability while maintaining plasma discharge between the target electrode having the sputtering target thereon and the substrate electrode having the substrate thereon. To attain this, the frequency of the high frequency power applied to the target electrode must be selectively determined. In a preferred embodiment, it is from 50 MHz to 300 MHz.

The switching from the deposition step to the non-deposition step or from the latter to the former in the bias sputtering method of the present invention can be conducted by means of mechanically controlling the on-off switching of the DC power source electrically connected to the sputtering target electrode.

Alternatively, it can conducted by electrically controlling the periodic changing of the value of the DC voltage applied from the DC power source to the sputtering target electrode. The electrical control can include a means for generating a pulse signal with the use of a microcomputer and inputting said pulse signal into the DC power source through an amplifier.

The DC voltage which is applied to the target electrode in addition to the alternating voltage in order to sputter the target with the plasma must be of a value which is more negative than −40 V in the case of depositing a silicon film on the substrate. Specifically, the DC voltage in this case is desired to be in the range of −100 V to −500 V.

The timing of the alternation between the deposition step and the non-deposition step in the bias sputtering method of the present invention is determined depending upon the kind of deposited film to be formed, the deposition rate during film formation, etc. In the case of forming an epitaxial silicon deposited film, the following two relations should be satisfied:

$Td \leq 5.43/N$ and $Td \leq Ta$, with N being the deposition rate (Å/sec.), Td being the film formation period (the period during which the step of depositing the film on the substrate is conducted), and Ta being the ion assist period (the non-deposition period during which the step of irradiating the substrate with ions of the plasma without film deposition is conducted).

As the sputtering gas usable in the bias sputtering method of the present invention, there can be mentioned inert gases such as Ar, He, Ne, Xe, and Rn. These gases should be of a high purity and may be purified by means of a gas purifying apparatus prior to entering into the film-forming chamber (the vacuum vessel).

As for the target used in the bias sputtering method of the present invention, it is selectively used depending upon the kind of deposited film desired. Specific examples are a single crystal Si target, a polycrystalline Si target, semiconductor targets of Ge or the like, metallic targets of Al, Mo, or the like.

As the substrate used in the bias sputtering method of the present invention, there can be mentioned single crystal members, polycrystalline members, and the like. In the case of forming an epitaxial deposited film, single crystal members are used.

For the substrate temperature upon film formation in the bias sputtering method of the present invention, can be from 250° C. to 500° C. However, when the temperature is from 250° C. to 380° C., the advantages of the present invention are most desirably exhibited.

The pressure inside the film-forming chamber (the vacuum vessel) during film formation in the bias sputtering method of the present invention should be set such that discharge is generated and maintained in a desirable state in the film-forming chamber. Specifically, it is set from 1 mTorr to 50 mTorr.

The bias sputtering method of the present invention may be employed also for forming a deposited film by the so-called reactive sputtering process in which a gas is used which reacts with particles (atoms) sputtered from the target to form a deposited film on a substrate.

The bias sputtering method of the present invention may use an appropriate bias sputtering apparatus wherein a DC voltage is applied to the target electrode. A specific example of such apparatus is shown in FIG. 1.

The advantages of the present invention will be described in more detail by reference to examples, which are provided here for illustrative purposes only, and not intended to limit the scope of the invention.

EXAMPLE 1

Figure 6:
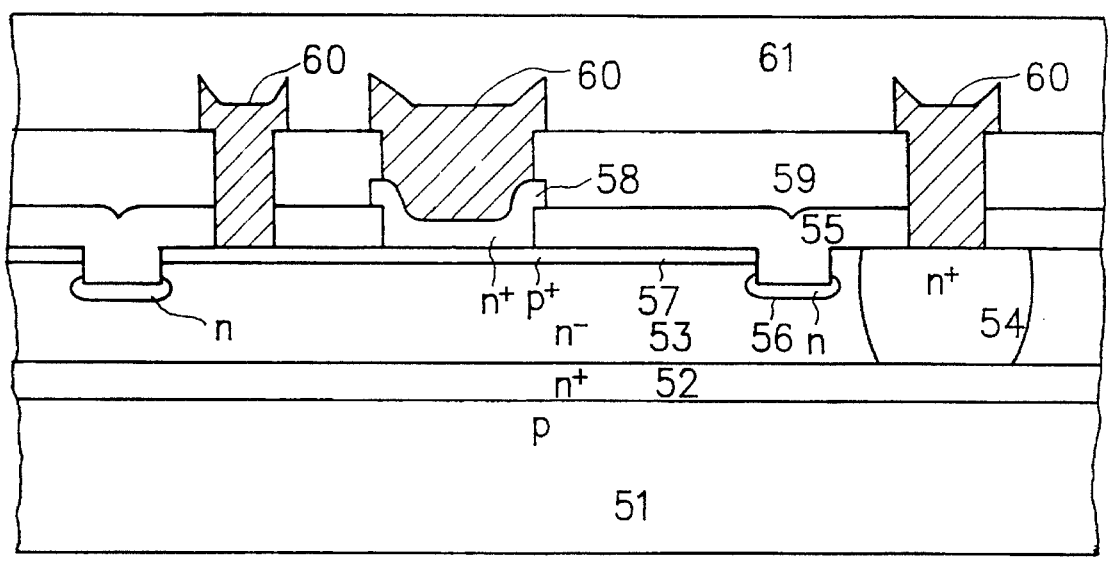
Figure 7:
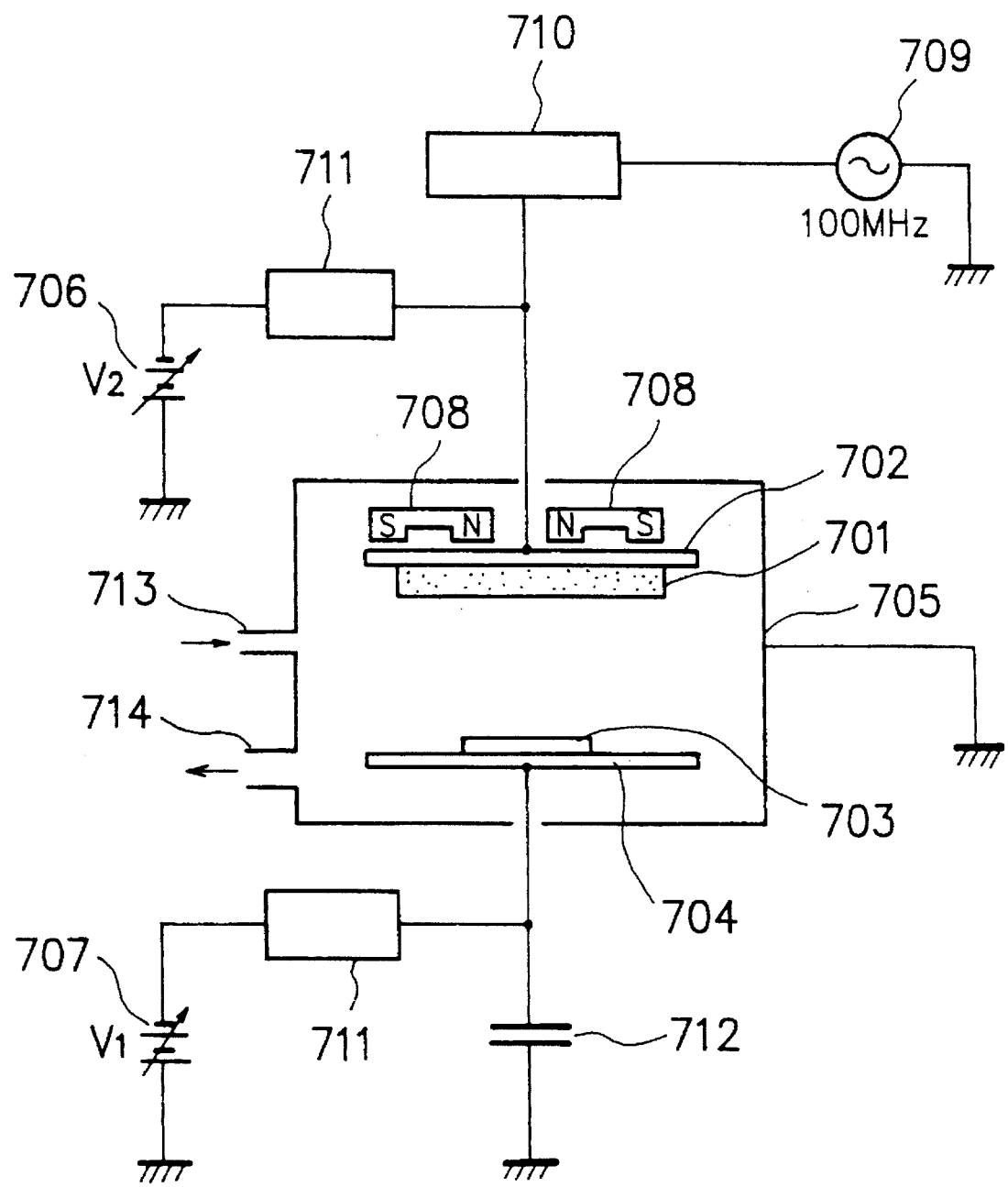
FIG. 7 is a schematic diagram illustrating a conventional bias sputtering apparatus.

There was prepared a bipolar transistor of the configuration shown in FIG. 6.

Figure 5:
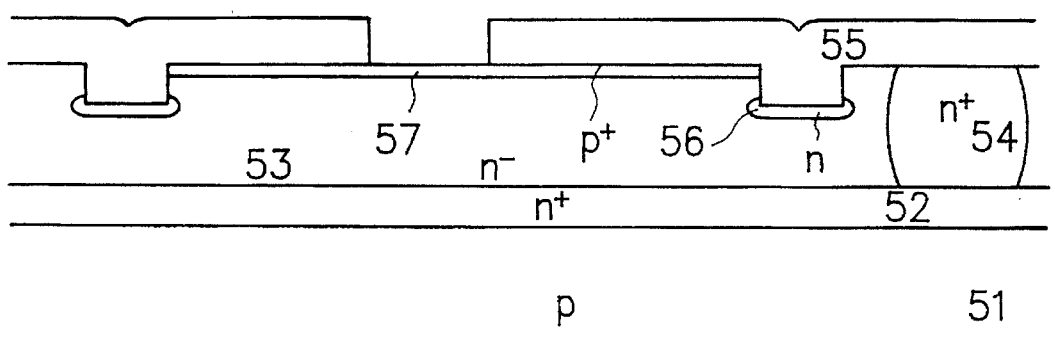
FIG. 5 and FIG. 6 are schematic explanatory views for explaining the steps of preparing a bipolar transistor according to the present invention.

1. Preparation of a Precursor of the Configuration Shown in FIG. 5 for the Bipolar Transistor 1-(1) There was provided a p-type Si wafer 51 of 4Ω cm resistivity. On the p-type Si wafer 51, an $n^+$-type embedding layer 52 was formed by means of a conventional thermal diffusion technique.

1-(2) A 1.2 μm thick n-type layer 53 was formed on the $n^+$-type embedding layer 52 by means of a conventional CVD technique.

1-(3) An $n^+$-region 54 was formed at a selected portion of the $n^-$-layer 53 by means of a conventional thermal diffusion technique, using a mask pattern.

1-(4) A mask pattern was disposed on the $n^-$-type layer 53 of the resultant obtained in the step 1-(3), followed by a conventional reactive ion etching technique to thereby form a groove for forming an element dividing region 55. Then, As ions were implanted at a dose of $2\times10^{13}$ cm$^{-2}$ into the bottom of the groove by means of a conventional ion implanting technique to form a channel stop region 56 at the bottom of the groove. After removing the mask pattern, a 2000 Å thick SiO$_2$ film was deposited on the resultant to form the element dividing region 55.

1-(5) Boron (B) ions (as a p-type impurity) were implanted at a dose of $8\times10^{13}$ cm$^{-2}$ into the n$^-$-type layer region 53 through the SiO$_2$ film to form a base region 57 comprised of a p$^+$-type single crystal material. Successively, a contact hold for forming an emitter region 58 (see FIG. 6) was formed by mean of a conventional reactive ion etching technique so as to expose the base region 57 therein.

Thus, there was obtained a precursor for a bipolar transistor.

2. Preparation of Bipolar Transistor

Using the precursor obtained above, there was prepared a bipolar transistor of the configuration shown in FIG. 6 in the following manner.

2-(1) The precursor obtained above was cleaned by a conventional substrate cleaning technique and then used as the substrate 104 in the bias sputtering apparatus shown in FIG. 1.

2-(2) The precursor as the substrate 104 was introduced into the load lock cheer 115 of the bias sputtering apparatus. Herein, as the sputtering target 112, where was used an n-type FZ(100) Si wafer of $1.8\times10^{18}$ cm$^{-3}$ in phosphorous (P) content and 5 inches in diameter.

The load lock chamber 115 was evacuated to bring the inside thereof to a vacuum of about $1\times10^{-10}$ by means of the vacuum system (not shown), and at the same time, the vacuum vessel 101 was also evacuated to bring the inside thereof to the same vacuum as that of the load lock chamber by actuating the oil-free vacuum system (not shown). Then, the gate valve 116 was opened, and the substrate 104 (the precursor) was moved into the vacuum vessel 101 by means of the transport means (not shown), whereby the substrate 104 (the precursor) was positioned on the substrate electrode 105. After closing the gate valve 116, the substrate 104 (the precursor) was heated to and maintained at 300° C. by energizing the heater (not shown) for the substrate. The inner pressure (the background vacuum) of the vacuum vessel 101 was $2.2\times10^{-10}$ Torr.

Then, the valve (not shown) of the gas cylinder 117 was opened to feed Ar gas (purity: 99.999%) into the vacuum vessel 101 through the feed pipe 118 while purifying the Ar gas by means of the gas purification device 119. The gas pressure in the vacuum vessel 101 was adjusted to and maintained at 10 mTorr. Then, the RF power source 106 was switched on to apply a high frequency power of 30 W (100 MHz), and the DC power source 108 was switched on to apply a DC voltage of −30 V. The DC power source 109 was also switched on to apply a DC voltage of +15 V, to generate a plasma in the vacuum vessel 101, thus cleaning the surface of the substrate 104 (the precursor) with the plasma for 5 minutes.

Film formation was conducted under the conditions shown in Table 11 while controlling the DC voltage applied from the DC power source 108 to the target electrode 102 by inputting a pulse generated by a microcomputer (not shown) through an amplifier (not shown) into the DC power source 108. Thus, there was formed an about 3000 Å thick epitaxial silicon film for forming emitter region 58. The epitaxial silicon film thus formed was subjected to patterning to form emitter regions 58.

2-(3) A 0.5 µm thick SiO$_2$ insulating film 59 was formed by means of a conventional plasma CVD technique, followed by forming contact holes for forming wiring electrodes 60. Thereafter, an aluminum film was formed by a conventional sputtering technique, followed by patterning, to thereby form wiring electrodes 60.

2-(4) Then, a SiO$_2$ insulating film as a protective layer 61 was formed on the resultant obtained in the step 2-(3) by means of a conventional plasma CVD technique, followed by processing by a conventional semiconductor processing technique to form output pads.

Thus, there was obtained a bipolar transistor of the configuration shown in FIG. 6.

As is apparent from the above description, the formation of the emitter region 58 was conducted at a low temperature of 300° C., and the successive steps were conducted at a relatively low processing temperature.

The resultant bipolar transistor was examined. As a result, it was found that each of the constituent regions including the base region and emitter region of the bipolar transistor is extremely low in terms of dopant diffusion and that the bipolar transistor stably exhibits an improved current amplification factor ($h_{fc}$).

EXAMPLE 2

The procedures of step 2-(2) in Example 1 were repeated, except that the precursor substrate 104 was replaced by a p-type FZ(100) Si wafer of $1.0\times10^{15}$ cm$^{-3}$ in boron (B) content and the substrate temperature upon film formation was changed to 250° C., to form a 1000 Å thick epitaxial silicon film on the p-type Si wafer.

For the resultant silicon film sample, its etch pit density was measured by a conventional Wright etching method as described in J. Electrochem. Soc. Vol. 124, No. 5, pp. 757–762 (1977), and its defect stacking and transition defect density were measured by a conventional cross-section transmission electron microscope. The epitaxial silicon film sample was found to be in the range of $1.0\times10^7$/cm$^2$ to $1.0\times10^8$/cm$^2$ with respect to the etch pit density and the stacking and transition defect density.

In addition, the epitaxial silicon film sample was evaluated with respect to electron mobility and hole mobility by means of the Van der Pauw method. It was found that the electron mobility and hole mobility were in close proximity to those of a bulk silicon.

Thus, it was found that the epitaxial silicon film is suitable for use in preparing a semiconductor device.

TABLE 1

| | |
|---|---|
| high frequency power from the high frequency power source 106 | 200 W |
| DC voltage from the DC power source 108 | −200 V |
| DC voltage from the DC power source 109 | +5 V |
| inner pressure of the vacuum vessel 101 | 10 mTorr |
| temperature of the substrate 104 | 300° C. ≈ 500° C. |
| film formation period | 12 minutes |

TABLE 2

| substrate temperature (°C.) | resistivity (Ω · cm) | Ar content (cm$^{-3}$) | O content (cm$^{-3}$) | C content (cm$^{-3}$) | p-n junction reverse current (A/cm$^2$) | crystal analysis (by electron diffraction) | background vacuum (Torr) |
|---|---|---|---|---|---|---|---|
| 300 | $2.0 \times 10^{-2}$ (Δ) | $8.2 \times 10^{18}$ (X) | $1.3 \times 10^{17}$ (⊙) | $6.3 \times 10^{17}$ (⊙) | $2.3 \times 10^{-9}$ (X) | Kikuchi line (⊙) | $2.1 \times 10^{-10}$ |
| 350 | $1.8 \times 10^{-2}$ (Δ) | $3.0 \times 10^{18}$ (X) | $1.4 \times 10^{18}$ (⊙) | $7.9 \times 10^{17}$ (⊙) | $6.9 \times 10^{-10}$ (Δ) | Kikuchi line (⊙) | $3.4 \times 10^{-10}$ |
| 400 | $1.7 \times 10^{-2}$ (O) | $1.7 \times 10^{18}$ (O) | $1.5 \times 10^{18}$ (⊙) | $8.5 \times 10^{17}$ (⊙) | $6.3 \times 10^{-10}$ (O) | Kikuchi line (⊙) | $4.2 \times 10^{-10}$ |
| 450 | $1.5 \times 10^{-2}$ (⊙) | $1.2 \times 10^{18}$ (O) | $1.7 \times 10^{18}$ (⊙) | $9.3 \times 10^{17}$ (⊙) | $5.7 \times 10^{-10}$ (O) | Kikuchi line (⊙) | $5.0 \times 10^{-10}$ |
| 500 | $1.4 \times 10^{-4}$ (⊙) | $1.1 \times 10^{18}$ (O) | $2.5 \times 10^{18}$ (O) | $1.3 \times 10^{17}$ (O) | $4.2 \times 10^{-10}$ (⊙) | Kikuchi line (⊙) | $7.8 \times 10^{-10}$ |

⊙: excellent
O: good
Δ: practically acceptable
X: practically unacceptable

TABLE 3

| | |
|---|---|
| high frequency power from the high frequency power source 106 | 200 W |
| DC voltage from the DC power source 108 | switching between −200 V and 0 V at intervals of 3 seconds |
| DC voltage from the DC power source 109 | +5 V |
| inner pressure of the vacuum vessel 101 | 10 mTorr |
| temperature of the substrate 104 | 300° C. |
| film formation period | 15 minutes |

TABLE 4

| substrate temperature (°C.) | resistivity (Ω · cm) | Ar content (cm$^{-3}$) | O content (cm$^{-3}$) | C content (cm$^{-3}$) | p-n junction reverse current (A/cm$^2$) | crystal analysis (by electron diffraction) | background vacuum (Torr) |
|---|---|---|---|---|---|---|---|
| 150 | $1.8 \times 10^{-2}$ (Δ) | $7.8 \times 10^{18}$ (X) | $1.0 \times 10^{18}$ (⊙) | $5.7 \times 10^{17}$ (⊙) | $1.0 \times 10^{-9}$ (X) | Kikuchi line (⊙) | $2.0 \times 10^{-10}$ |
| 200 | $1.6 \times 10^{-2}$ (Δ) | $3.0 \times 10^{18}$ (Δ) | $1.1 \times 10^{18}$ (⊙) | $5.8 \times 10^{17}$ (⊙) | $7.0 \times 10^{-10}$ (Δ) | Kikuchi line (⊙) | $2.0 \times 10^{-10}$ |
| 250 | $1.5 \times 10^{-2}$ (⊙) | $1.8 \times 10^{18}$ (O) | $1.3 \times 10^{18}$ (⊙) | $5.9 \times 10^{-17}$ (⊙) | $5.5 \times 10^{-10}$ (⊙) | Kikuchi line (⊙) | $2.0 \times 10^{-10}$ |
| 300 | $1.5 \times 10^{-2}$ (⊙) | $1.5 \times 10^{18}$ (O) | $1.3 \times 10^{18}$ (⊙) | $6.1 \times 10^{-17}$ (⊙) | $4.8 \times 10^{-10}$ (⊙) | Kikuchi line (⊙) | $2.0 \times 10^{-10}$ |
| 350 | $1.5 \times 10^{-2}$ (⊙) | $1.3 \times 10^{18}$ (O) | $1.5 \times 10^{18}$ (⊙) | $7.8 \times 10^{17}$ (⊙) | $4.7 \times 10^{-10}$ (⊙) | Kikuchi line (⊙) | $3.4 \times 10^{-10}$ |
| 380 | $1.4 \times 10^{-2}$ (⊙) | $1.1 \times 10^{18}$ (O) | $1.5 \times 10^{18}$ (⊙) | $8.2 \times 10^{17}$ (⊙) | $4.6 \times 10^{-10}$ (O) | Kikuchi line (⊙) | $3.7 \times 10^{-10}$ |
| 400 | $1.4 \times 10^{-2}$ (⊙) | $1.0 \times 10^{18}$ (O) | $1.5 \times 10^{18}$ (⊙) | $8.6 \times 10^{17}$ (⊙) | $4.5 \times 10^{-10}$ (O) | Kikuchi line (⊙) | $4.1 \times 10^{-10}$ |
| 450 | $1.4 \times 10^{-2}$ (⊙ | $9.8 \times 10^{17}$ (O) | $1.8 \times 10^{18}$ (⊙) | $9.2 \times 10^{17}$ (⊙) | $4.3 \times 10^{-10}$ (O) | Kikuchi line (⊙) | $4.9 \times 10^{-10}$ |
| 500 | $1.4 \times 10^{-2}$ (⊙) | $9.6 \times 10^{17}$ (O) | $2.5 \times 10^{18}$ (O) | $1.2 \times 10^{18}$ (O) | $4.1 \times 10^{-10}$ (⊙) | Kikuchi line (⊙) | $7.8 \times 10^{-10}$ |

⊙: excellent
O: good
Δ: practically acceptable
X: practically unacceptable

TABLE 5

| DC voltage applied to target electrode: −200 V | | | |
|---|---|---|---|
| each of the repetitive deposition period and non-deposition period (seconds) | Ar content (cm$^{-3}$) | O Content (cm$^{-3}$) | C content (cm$^{-3}$) |
| 1 | 8.9 × 10$^{17}$ (O) | 1.2 × 10$^{18}$ (⊙) | 6.1 × 10$^{17}$ (⊙) |
| 2 | 9.8 × 10$^{17}$ (O) | 1.2 × 18$^{18}$ (⊙) | 6.0 × 10$^{17}$ (⊙) |
| 3 | 1.5 × 10$^{18}$ (O) | 1.3 × 10$^{18}$ (⊙) | 6.1 × 10$^{17}$ (⊙) |
| 4 | 1.9 × 10$^{18}$ (O) | 1.3 × 10$^{18}$ (⊙) | 6.1 × 10$^{17}$ (⊙) |
| 5 | 3.2 × 10$^{18}$ (X) | 1.3 × 10$^{18}$ (⊙) | 6.1 × 10$^{17}$ (⊙) |
| 6 | 3.9 × 10$^{18}$ (X) | 1.2 × 10$^{18}$ (⊙) | 6.0 × 10$^{17}$ (⊙) |

⊙: excellent
O: good
Δ: practically acceptable
X: practically unacceptable

TABLE 6

| DC voltage applied to target electrode: −100 V | | | |
|---|---|---|---|
| each of the repetitive deposition period and non-deposition period (seconds) | Ar content (cm$^{-3}$) | O Content (cm$^{-3}$) | C content (cm$^{-3}$) |
| 1 | 8.9 × 10$^{17}$ (O) | 1.2 × 10$^{18}$ (⊙) | 6.1 × 10$^{17}$ (⊙) |
| 2 | 8.9 × 10$^{17}$ (O) | 1.2 × 18$^{18}$ (⊙) | 6.0 × 10$^{17}$ (⊙) |
| 3 | 9.8 × 10$^{17}$ (O) | 1.3 × 10$^{18}$ (⊙) | 6.1 × 10$^{17}$ (⊙) |
| 4 | 1.2 × 10$^{18}$ (O) | 1.3 × 10$^{18}$ (⊙) | 6.1 × 10$^{17}$ (⊙) |
| 5 | 1.8 × 10$^{18}$ (O) | 1.3 × 10$^{18}$ (⊙) | 6.1 × 10$^{17}$ (⊙) |
| 6 | 1.9 × 10$^{18}$ (O) | 1.4 × 10$^{18}$ (⊙) | 6.2 × 10$^{17}$ (⊙) |
| 7 | 3.2 × 10$^{18}$ (X) | 1.3 × 10$^{18}$ (⊙) | 6.2 × 10$^{17}$ (⊙) |

⊙: excellent
O: good
Δ: practically acceptable
X: practically unacceptable

TABLE 7

| DC voltage applied to target electrode: −300 V | | | |
|---|---|---|---|
| each of the repetitive deposition period and non-deposition period (seconds) | Ar content (cm$^{-3}$) | O Content (cm$^{-3}$) | C content (cm$^{-3}$) |
| 1 | 9.6 × 10$^{17}$ (O) | 1.2 × 10$^{18}$ (⊙) | 6.1 × 10$^{17}$ (⊙) |
| 2 | 1.3 × 10$^{18}$ (O) | 1.2 × 10$^{18}$ (⊙) | 6.0 × 10$^{17}$ (⊙) |
| 3 | 2.0 × 10$^{18}$ (O) | 1.3 × 10$^{18}$ (⊙) | 6.0 × 10$^{17}$ (⊙) |
| 4 | 3.0 × 10$^{18}$ (X) | 1.3 × 10$^{18}$ (⊙) | 6.1 × 10$^{17}$ (⊙) |
| 5 | 3.2 × 10$^{18}$ (X) | 1.3 × 10$^{18}$ (⊙) | 6.1 × 10$^{17}$ (⊙) |
| 6 | 3.4 × 10$^{18}$ (X) | 1.4 × 10$^{18}$ (⊙) | 6.2 × 10$^{17}$ (⊙) |

⊙: excellent
O: good
Δ: practically acceptable
X: practically unacceptable

TABLE 8

| the non-deposition period (ion assist only) (seconds) | Ar content ($cm^{-3}$) | O Content ($cm^{-3}$) | C content ($cm^{-3}$) |
|---|---|---|---|
| 1 | $3.8 \times 10^{18}$ (X) | $1.2 \times 10^{18}$ (⊚) | $6.0 \times 10^{17}$ (⊚) |
| 2 | $3.1 \times 10^{18}$ (X) | $1.2 \times 18^{18}$ (⊚) | $6.0 \times 10^{17}$ (⊚) |
| 3 | $1.5 \times 10^{18}$ (O) | $1.3 \times 10^{18}$ (⊚) | $6.1 \times 10^{17}$ (⊚) |
| 4 | $1.1 \times 10^{18}$ (O) | $1.3 \times 10^{18}$ (⊚) | $6.1 \times 10^{17}$ (⊚) |
| 5 | $9.6 \times 10^{17}$ (O) | $1.3 \times 10^{18}$ (⊚) | $6.1 \times 10^{17}$ (⊚) |
| 6 | $9.1 \times 10^{17}$ (O) | $1.3 \times 10^{18}$ (⊚) | $6.1 \times 10^{17}$ (⊚) |

⊚: excellent
O: good
Δ: practically acceptable
X: practically unacceptable

TABLE 9

| | |
|---|---|
| high frequency power from the high frequency power source 106 | 10 MHz ≈ 400 MHz (200 W) |
| DC voltage from the DC power source 109 | +5 V |
| inner pressure of the vacuum vessel 101 | 10 mTorr |
| temperature of the substrate 104 | 300° C. |

TABLE 10

| discharge frequency (MHz) | energy distribution half width (eV) |
|---|---|
| 13.56 | 22.5 |
| 20 | 19.1 |
| 30 | 17.4 |
| 40 | 13.5 |
| 50 | 9.9 |
| 60 | 8.1 |
| 100 | 6.2 |
| 200 | 5.1 |
| 300 | 4.9 |
| 400 | no discharge occurred |

TABLE 11

| | |
|---|---|
| high frequency power from the high frequency power source 106 | 200 W |
| DC voltage from the DC power source 108 | switching between −200 W and 0 V at intervals of 3 seconds |
| DC voltage from the DC power source 109 | +5 V |
| inner pressure of the vacuum vessel 101 | 10 mTorr |
| temperature of the substrate 104 | 300° C. |
| film formation period | 80 minutes |

What is claimed is:

1. A process for forming a functional epitaxial film on a substrate by a bias sputtering method comprising generating a plasma of a sputtering gas between a target electrode having a target thereon and a substrate electrode having a substrate for film formation thereon in a vacuum vessel with the use of a high frequency energy with a frequency of 50 MHz to 300 MHz from a high frequency power source and sputtering said target with said plasma while applying a direct current voltage from a direct current power source to at least one of said target electrode and said substrate electrode thereby causing the formation of a film on said substrate, wherein a deposition step and a non-deposition step are alternately repeated, said deposition step comprising sputtering said target with said plasma while irradiating said substrate with ions of said plasma while depositing a film on said substrate, and said non-deposition step comprising irradiating said substrate with ions of said plasma without sputtering said target, thereby forming a high quality functional epitaxial film on said substrate.

2. The process for forming a functional epitaxial film according to claim 1, wherein the direct current power source is electrically connected to the target electrode, and the deposition step and the non-deposition step are switched between each other by controlling the direct current power source.

3. The process for forming a functional epitaxial film according to claim 2, wherein the controlling comprises on-off controlling the direct current power source.

4. The process for forming a functional epitaxial film according to claim 2, wherein the controlling comprises generating a pulse signal using a microcomputer and inputting said pulse signal to the direct current power source.

5. The process for forming a functional epitaxial film according to claim 1, wherein a direct current voltage of −100 V to −500 V is applied to the target electrode.

6. The process for forming a functional epitaxial film according to claim 1, wherein the inside of the vacuum vessel is maintained at a pressure of 1 mTorr to 50 mTorr.

7. The process for forming a functional epitaxial film according to claim 1, wherein the substrate is maintained at a temperature of 250° C. to 500° C.

8. The process for forming a functional epitaxial film according to claim 7, wherein the substrate is maintained at a temperature of 250° C. to 380° C.

9. The process for forming a functional epitaxial film according to claim 1, wherein the functional epitaxial film formed on the substrate is an epitaxial silicon film.

10. The process for forming a functional epitaxial film according to claim 9, wherein the alternate repetition of the deposition step and the non-deposition step is conducted so as to satisfy the following two equations: $Td \leq 5.43/N$ and $Td \leq Ta$, with N being the deposition rate of the film deposited on the substrate in each deposition step, Td being the film formation period during which the film is deposited on the substrate in each deposition step, and Ta being the period during which the substrate is irradiated with ions of the plasma during each non-deposition step.

* * * * *

UNITED STATES PATENT AND TRADEMARK OFFICE
CERTIFICATE OF CORRECTION

PATENT NO. : 5,510,011

DATED : April 23, 1996

INVENTOR(S): NOBUYUKI OKAMURA ET AL.

It is certified that error appears in the above-identified patent and that said Letters Patent is hereby corrected as shown below: On title page, Item
[30] FOREIGN APPLICATION PRIORITY DATA "Oct. 29, 1993 [JP] Japan......4-292459" should read
--Oct. 29, 1993 [JP] Japan.....5-292459--.

COLUMN 7

Line 14, "cheer" should read --chamber--; and

Line 25, "vessel 10i" should read --vessel 101--.

COLUMN 8

Line 4, "obtained" should read --be obtained--.

COLUMN 13

Line 16, "than" should read --that--.

COLUMN 14

Line 27, "30 MHz," should read --300 MHz,--.

COLUMN 16

Line 25, "can" should read --it can--; and

Line 59, "n-type" should read --n$^-$-type--.

UNITED STATES PATENT AND TRADEMARK OFFICE
CERTIFICATE OF CORRECTION

PATENT NO. : 5,510,011

DATED : April 23, 1996

INVENTOR(S): NOBUYUKI OKAMURA ET AL.

It is certified that error appears in the above-identified patent and that said Letters Patent is hereby corrected as shown below:

COLUMN 17

Line 11, "hold" should read --hole--;

Line 12, "mean" should read --means--;

Line 24, "cheer 115" should read --chamber 115--;

Line 25, "where" should read --there--;

Line 29, "$1 \times 10^{-10}$" should read $1 \times 10^{-10}$Torr. --; and

Line 64, "regions 58." should read --region 58.--.

COLUMN 18

Line 25, "factor $(h_{ic})$." should read --factor $(h_{fe})$.--; and

Line 40, "defect stacking" should read --factor $(h_{fe})$.--

UNITED STATES PATENT AND TRADEMARK OFFICE
CERTIFICATE OF CORRECTION

PATENT NO. : 5,510,011

DATED : April 23, 1996

INVENTOR(S) : NOBUYUKI OKAMURA ET AL.

It is certified that error appears in the above-identified patent and that said Letters Patent is hereby corrected as shown below:

COLUMN 19

T2, "O content        --O content
    ($cm^{-3}$)    should read    ($cm^{-3}$)
    $1.3 \times 10^{17}$"          $1.3 \times 10^{18}$--.

COLUMN 21

T7, "$1.2 \times 10^{18}$        --$1.2 \times 10^{18}$
    $1.3 \times 10^{18}$"   should read   $1.2 \times 10^{18}$--.

COLUMN 23

T8, "$1.2 \times 18^{18}$" should read --$1.2 \times 10^{18}$--.

Signed and Sealed this

Fifth Day of November, 1996

Attest:

BRUCE LEHMAN

*Attesting Officer*      *Commissioner of Patents and Trademarks*